(12) United States Patent
Guan et al.

(10) Patent No.: US 9,000,481 B2
(45) Date of Patent: Apr. 7, 2015

(54) LOW CAPACITANCE TRANSIENT VOLTAGE SUPPRESSOR (TVS) WITH REDUCED CLAMPING VOLTAGE

(71) Applicant: Alpha & Omega Semiconductor Incorporated, Sunnyvale, CA (US)

(72) Inventors: Lingpeng Guan, San Jose, CA (US); Madhur Bobde, Sunnyvale, CA (US); Anup Bhalla, Santa Clara, CA (US); Jun Hu, San Bruno, CA (US); Wayne F. Eng, Danville, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/469,103

(22) Filed: Aug. 26, 2014

(65) Prior Publication Data

US 2014/0363946 A1 Dec. 11, 2014

Related U.S. Application Data

(60) Continuation of application No. 14/157,416, filed on Jan. 16, 2014, now Pat. No. 8,822,300, which is a division of application No. 13/170,965, filed on Jun. 28, 2011, now Pat. No. 8,698,196.

(51) Int. Cl.
| | |
|---|---|
| *H01L 29/66* | (2006.01) |
| *H01L 29/06* | (2006.01) |
| *H01L 21/20* | (2006.01) |
| *H01L 21/76* | (2006.01) |

(Continued)

(52) U.S. Cl.
CPC ...... *H01L 29/66113* (2013.01); *H01L 27/0248* (2013.01)

(58) Field of Classification Search
USPC .......... 257/173, 481, 653; 438/328, 380, 404, 438/413, 526
See application file for complete search history.

(56) References Cited

U.S. PATENT DOCUMENTS

| 5,583,348 | A | 12/1996 | Sundaram |
| 7,538,997 | B2 | 5/2009 | Mallikararjunaswamy |
| 7,554,839 | B2 | 6/2009 | Bobde |

(Continued)

FOREIGN PATENT DOCUMENTS

| WO | 2008066903 A | 6/2008 |
| WO | 2009042419 A | 4/2009 |

OTHER PUBLICATIONS

Notice of Allowance for U.S. Appl. No. 14/157,416, dated May 13, 2014.

*Primary Examiner* — Kevin Parendo
(74) *Attorney, Agent, or Firm* — Joshua D. Isenberg; JDI Patent

(57) ABSTRACT

A low capacitance transient voltage suppressor with reduced clamping voltage includes an n+ type substrate, a first epitaxial layer on the substrate, a buried layer formed within the first epitaxial layer, a second epitaxial layer on the first epitaxial layer, and an implant layer formed within the first epitaxial layer below the buried layer. The implant layer extends beyond the buried layer. A first trench is at an edge of the buried layer and an edge of the implant layer. A second trench is at another edge of the buried layer and extends into the implant layer. Each trench is lined with a dielectric layer. A set of source regions is formed within a top surface of the second epitaxial layer. The trenches and source regions alternate. A pair of implant regions is formed in the second epitaxial layer.

17 Claims, 13 Drawing Sheets

(51) Int. Cl.
*H01L 21/425* (2006.01)
*H01L 27/02* (2006.01)

(56) References Cited

U.S. PATENT DOCUMENTS

| | | | |
|---|---|---|---|
| 7,557,554 B2 | 7/2009 | Chang | |
| 7,781,826 B2 | 8/2010 | Mallikararjunaswamy et al. | |
| 7,880,223 B2 | 2/2011 | Bobde | |
| 7,893,778 B2 | 2/2011 | Mohtashemi | |
| 8,698,196 B2 | 4/2014 | Guan et al. | |
| 2004/0207021 A1 | 10/2004 | Russ et al. | |
| 2005/0045909 A1 | 3/2005 | Zhang | |
| 2006/0289874 A1 | 12/2006 | Das et al. | |
| 2007/0073807 A1 | 3/2007 | Bobde | |
| 2008/0121988 A1 | 5/2008 | Mallikararjunaswamy et al. |
| 2008/0218922 A1 | 9/2008 | Mallikararjunaswamy et al. |
| 2009/0045457 A1 | 2/2009 | Bobde |
| 2009/0057869 A1 | 3/2009 | Hebert et al. |
| 2009/0115018 A1 | 5/2009 | Mallikarjunaswamy |
| 2009/0231766 A1 | 9/2009 | Chang et al. |
| 2009/0261897 A1 | 10/2009 | Bobde |
| 2009/0268361 A1 | 10/2009 | Mallikarjunaswamy |
| 2009/0273328 A1 | 11/2009 | Chang |
| 2010/0276779 A1 | 11/2010 | Guan et al. |
| 2010/0314716 A1 | 12/2010 | Mallikararjunaswamy et al. |
| 2010/0321840 A1 | 12/2010 | Bobde |
| 2011/0095833 A1 | 4/2011 | Mohtashemi et al. |
| 2011/0127577 A1 | 6/2011 | Bobde |
| 2012/0086499 A1 | 4/2012 | Husain et al. |
| 2012/0293144 A1 | 11/2012 | Chang |
| 2013/0001694 A1 | 1/2013 | Guan et al. |
| 2014/0134825 A1 | 5/2014 | Guan et al. |

US 9,000,481 B2

LOW CAPACITANCE TRANSIENT VOLTAGE SUPPRESSOR (TVS) WITH REDUCED CLAMPING VOLTAGE

PRIORITY CLAIM

This Application is a continuation of U.S. patent application Ser. No. 14/157,416, filed Jan. 16, 2014, to Lingpeng Guan et al. entitled "LOW CAPACITANCE TRANSIENT VOLTAGE SUPPRESSOR (TVS) WITH REDUCED CLAMPING VOLTAGE, the entire disclosures of which are incorporated by reference herein. Application Ser. No. 14/157,416 is divisional of U.S. patent application Ser. No. 13/170,965, filed Jun. 28, 2011 to Lingpeng Guan et al., now U.S. Pat. No. 8,698,196, the entire disclosures of which are incorporated by reference herein.

FIELD OF INVENTION

This invention relates to integrated circuits and more specifically to a transient voltage suppressor (TVS).

BACKGROUND OF INVENTION

Transient voltage suppressors (TVS) are devices used to protect integrated circuits from damages caused by over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to provide protection to circumvent the damages that are likely to occur to the integrated circuits when such over voltage conditions occur. As an increasing number of devices are implemented with integrated circuits that are vulnerable to over voltage damages, demands for TVS protection are also increased. Exemplary applications of TVS can be found in USB power and data line protection, digital video interfaces, high speed Ethernet, Notebook computers, monitors and flat panel displays.

FIG. 1 shows a conventional TVS circuit implemented with a diode array commonly applied for electrostatic discharge (ESD) protection of high bandwidth data buses. The TVS circuit 100 includes a main Zener diode 101 operated with two sets of steering diodes, i.e., the high-side steering diode 103 and the low-side steering diode 105. The high side steering diode 103 connects to the voltage source $V_{cc}$ and the low side steering diode 105 connects to the ground terminal Gnd with an input/output port I/O connected between the high side and low side steering diodes. The Zener diode 101 has a large size and functions as an avalanche diode from the high voltage terminal, i.e., terminal $V_{cc}$ to the ground voltage terminal, i.e., terminal Gnd. At a time when a positive voltage strikes the I/O (input/output) terminal, the high side diode provides a forward bias and is clamped by the large Zener diode.

Several device characteristics are desirable in such a TVS. A low TVS clamping voltage is desired to better protect an integrated circuit connected to the TVS. A low clamping voltage will ensure that any electrostatic discharge (ESD) will be diverted from the integrated circuit. The device clamping voltage is highly dependent on the breakdown voltage of the Zener/Avalanche diode. Thus, it is also desirable to maintain a low breakdown voltage at the Zener/Avalanche diode in order to improve clamping voltage. The term Zener and Avalanche will be used interchangeably hereinafter to describe a diode that exhibits avalanche breakdown properties. In addition to having a low clamping voltage, and low avalanche diode breakdown voltage, it is also desirable to have an extremely low overall device capacitance. A low device capacitance translates to higher allowable bandwidth and reduction of insertion loss during device operation. It is also desirable to reduce die package size of such TVS devices in order to reduce costs and maintain compatibility with shrinking integrated circuits.

With current TVS devices, there is still a further demand to reduce die size, to reduce device capacitance, and to improve breakdown voltage and clamping voltage characteristics. Therefore, there is a need to provide new and improved device configurations with new structural layouts and manufacturing methods to achieve these goals.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Introduction

Figure 1:
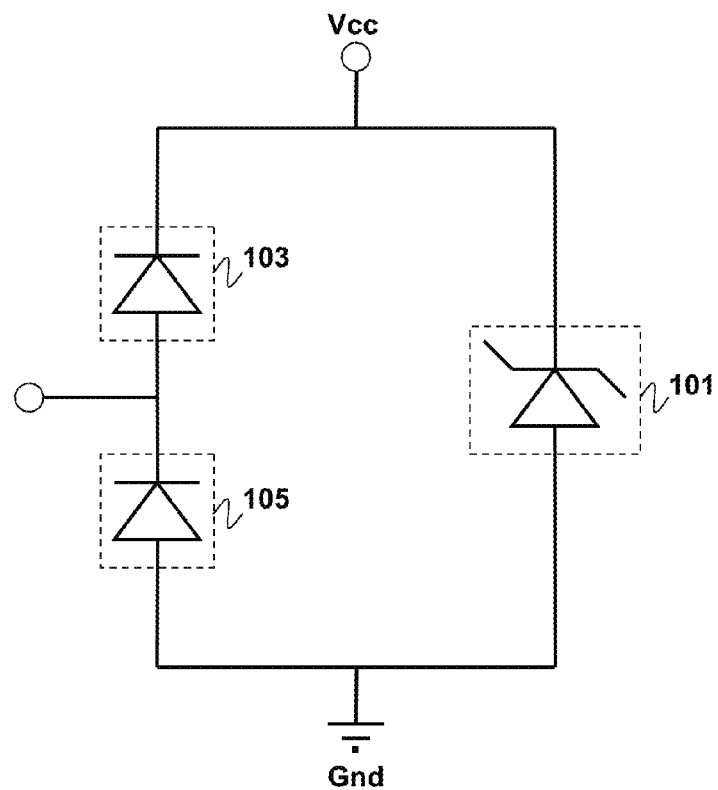
FIG. 1 is a circuit diagram illustrating a conventional transient voltage suppressor (TVS) circuit with a diode array in parallel with an avalanche diode.
Figure 2:
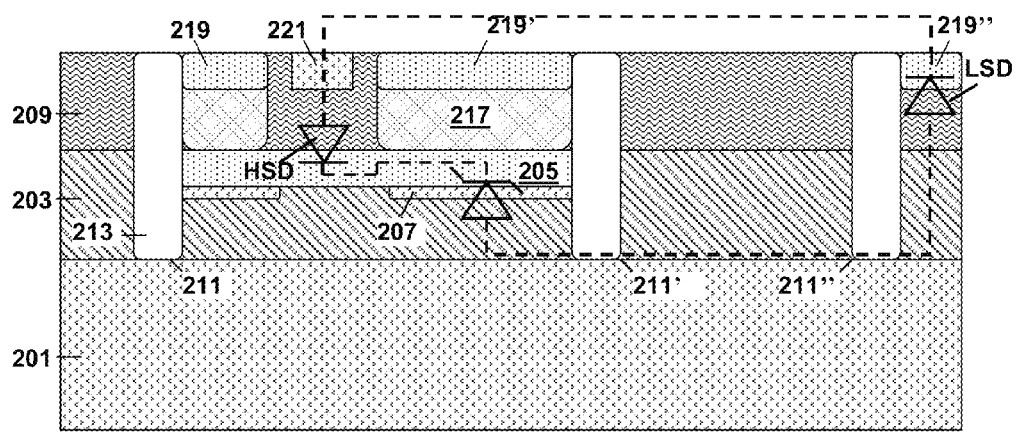
FIG. 2 is a cross-sectional schematic diagram illustrating a conventional transient voltage suppressor (TVS) device in accordance with the prior art.

FIG. 2 is a cross-sectional schematic diagram illustrating a conventional transient voltage suppressor (TVS) device 200 in accordance with the prior art. This conventional TVS 200 behaves in accordance with the TVS 100 described above in the circuit diagram of FIG. 1.

The TVS 200 is formed on a heavily doped p+ semiconductor substrate 201 which supports a first epitaxial layer 203 and a second epitaxial layer 209. The first epitaxial layer 203 is a lightly doped p− layer. This first epitaxial layer 203 may be doped with Boron having a concentration on the order of $10^{15}/cm^3$. The second epitaxial layer 209 is a very lightly doped p− layer. This second epitaxial layer 209 may also be doped with Boron, having an even lower doping concentration on the order of $10^{14}/cm^3$ or lower. Because the doping concentration of the second epitaxial layer 209 contributes significantly to the capacitance of both the high-side steering diode HSD and low-side steering diode LSD it is desirable to set the doping concentration of this layer 209 as low as possible (capacitance is directly proportional to doping concentration). The capacitances of the steering diodes HSD, LSD will contribute significantly to the overall capacitance of the TVS 200 because the steering diodes HSD, LSD are connected in parallel with the Zener diode. Thus, the capacitances of the steering diodes HSD, LSD may be used to effectively lower the overall TVS capacitance to a desired value regardless of the capacitance of the Zener diode.

An n+ buried layer 205 is formed within the first epitaxial layer 203. This n+ buried layer 205 forms the cathode of the high-side steering diode HSD, to be described in more detail below. A p+ implant layer 207 is implanted within the first epitaxial layer 203 below the n+ buried layer 205. The p+ implant layer 207 is partitioned into two segments with a gap under the high side steering diode HSD in order to avoid a high doping layer underneath the high-side steering diode HSD. The Zener diode is formed by the n+ buried layer 205, the p+ implant layer 207, the first epitaxial layer 203, and the p+ substrate 201. The n+ buried layer 205 forms the cathode of the Zener diode and the p+ implant layer 207, first epitaxial layer 203, and p+ substrate 201 collectively form the anode of the Zener diode.

A set of isolation trenches 211, 211', 211" is formed within both the second epitaxial layer 209 and the first epitaxial layer 203 and filled with dielectric material 213 (e.g., silicon oxide). Alternatively, the isolation trenches 211, 211', 211" may be lined with dielectric material 213 and filled with polysilicon (not shown) for ease of processing. The isolation trenches 211, 211', 211" are configured to isolate the low-side steering diode LSD from the high-side steering diode HSD integrated with the Zener diode.

A set of n+ source regions 219, 219', 219" are formed within the second epitaxial layer 209. The first and second source regions 219, 219' are located adjacent the right sidewall of the first isolation trench 211 and left sidewall of the second isolation trench 211' respectively, as illustrated. The third source region 219" is located adjacent the right sidewall of the third isolation trench 211". The vertical low-side steering diode LSD is formed by the third source region 219", the second epitaxial layer 209, the first epitaxial layer 203 and the substrate 201. The second epitaxial layer 209, first epitaxial layer 203, and substrate 201 collectively form the anode of the low-side steering diode LSD and the third source region 219" forms the cathode of the low-side steering diode LSD. The anode of the low-side steering diode LSD is electrically connected to the anode of the Zener diode through the substrate 201.

A p+ implant region 221 is formed within the top layer of the second epitaxial layer 209 between the first and second source regions 219, 219'. The high side diode HSD is formed by the p+ implant region 221, the second epitaxial layer 209 and the n+ buried layer 205. The p+ implant region 221 and second epitaxial layer 209 collectively form the anode of the high side steering HSD diode and the n+ buried layer 205 forms the cathode of the high side steering diode HSD. The cathode of the high side steering diode HSD is electrically connected to the cathode of the Zener diode through the n+ buried layer 205.

Additionally, an isolation layer (not shown) may be formed above the second epitaxial layer 209 with openings formed therein to provide for metal contacts. A Vcc pad (not shown) may make contact to the second source region 219' above the Zener diode through an opening in the isolation layer. An n-type sinker region 217 may be formed between the second source region 219' and the n+ buried layer 205 to allow the Zener diode to form a connection at the top surface of the device 200. In reverse mode, the n-type sinker region 217 acts as part of a PN junction that can be used to improve the clamping performance of an N+ source to the substrate 201 both in positive and negative mode. An I/O pad (not shown) may make contact to the p+ implant region 221 (i.e., anode of high-side steering diode) through another opening in the isolation layer. Additionally, a second I/O pad (not shown) may make contact to the third source region 219" (i.e., cathode of low-side steering diode) through yet another opening in the isolation layer.

As illustrated, the conventional TVS 200 operates and functions as described above with respect to the circuit diagram in FIG. 1. This conventional TVS 200 exhibits several desirable device characteristics. For one, the conventional TVS 200 is built on a p-type substrate 201, which allows for the substrate to act as ground, facilitating easier integration of the steering diodes HSD, LSD and the Zener diode. Additionally, the conventional TVS 200 exhibits low capacitance due to light doping of the second epitaxial layer 209 as well as a small device package size attributed to vertical integration of the steering diodes and Zener diode.

While the conventional TVS 200 exhibits several desirable device characteristics, it continues to suffer from certain undesirable device performance characteristics that render it non-ideal. For all TVS devices, a low clamping voltage is desired in order to provide better protection to an integrated circuit connected to it. The clamping voltage of the TVS is directly proportional to the breakdown voltage of the Zener diode, and as such is limited by the breakdown characteristics of the Zener diode.

The doping concentration of the p+ implant layer 207 at the Zener diode junction determines the breakdown voltage of the Zener diode. While increasing the doping concentration of the p+ implant layer will lower the Zener diode breakdown voltage, there is a certain threshold whereby further increasing the doping concentration will lead to significant reverse leakage current that has the potential to destroy the device. As such, in the conventional TVS 200, it is difficult to implement a Zener diode breakdown voltage below 6V. With several existing applications requiring a Vcc of 3V or less, such a TVS 200 is insufficient. Thus, it is desirable to fabricate a TVS device with improved breakdown voltage and clamping voltage characteristics, while maintaining the low capacitance and small device package size of the conventional TVS 200.

Improved TVS Devices

Embodiments of the present invention involve TVS devices with improved breakdown voltage characteristics, and hence improved clamping voltage characteristics achieved by implementing an N-P-N structure, rather than a Zener diode to function as an avalanche diode. The TVS device is no longer formed on a p+ substrate, but is instead constructed using an n+ substrate to facilitate integration of the N-P-N avalanche diode. The new TVS device retains the low capacitance as well as the small device packaging of its predecessor. Embodiments of the present invention will be discussed in further detail below.

Figure 3A:
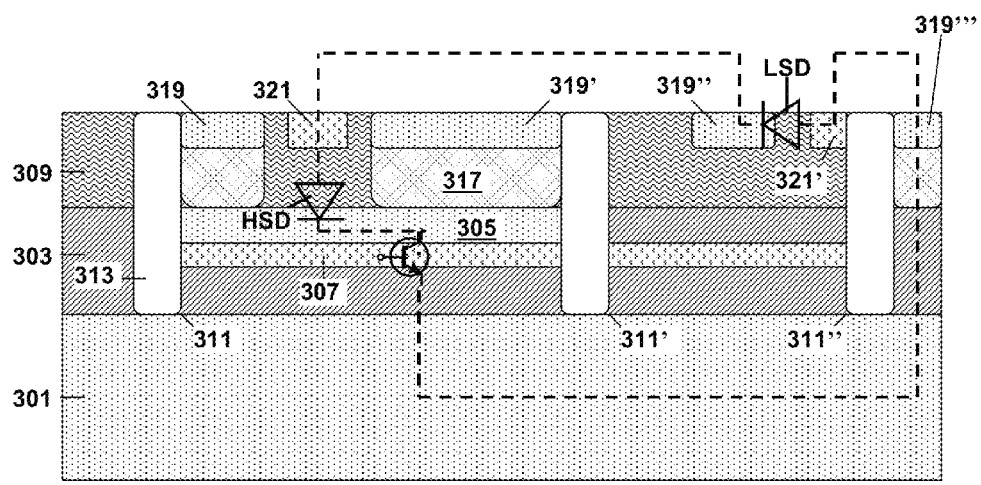
FIG. 3A is a cross-sectional schematic diagram illustrating a transient voltage suppressor (TVS) device in accordance with an embodiment of the present invention.

FIG. 3A illustrates a cross-sectional schematic diagram of a transient voltage suppressor (TVS) device in accordance with an embodiment of the present invention. This TVS 300 is configured to retain the low capacitance and small device package size of the conventional TVS 200, while improving breakdown voltage and clamping voltage characteristics. The TVS 300 in FIG. 3 continues to behave in accordance with the TVS 100 described above in the circuit diagram of FIG. 1.

The TVS 300 is formed on a heavily doped n+ semiconductor substrate 301 which supports a first epitaxial layer 303 and a second epitaxial layer 309. An n+ substrate 301 is used rather than a p+ substrate in order to integrate the avalanche diode as an N-P-N structure rather than a P-N diode. The N-P-N structure exhibits certain behavioral characteristics that make it more advantageous for use in a TVS than a P-N diode. These advantages will be discussed in further detail below. The N-P-N structure will also be referred to as the avalanche diode hereinafter.

The first epitaxial layer 303 is a lightly doped n− layer. This first epitaxial layer 303 may be doped with phosphorous having a concentration on the order of $2\times10^{16}/cm^3$. The second epitaxial layer 309 is a very lightly doped p− layer. This second epitaxial layer 309 may be doped with Boron, having a minimal doping concentration on the order of $10^{14}/cm^3$ or lower. Because the doping concentration of the second epitaxial layer 309 contributes significantly to the capacitance of both the high-side steering diode HSD and low-side steering diode LSD it is desirable to set the doping concentration of this layer 309 as low as possible. The capacitances of the steering diodes HSD, LSD will contribute significantly to the overall capacitance of the TVS 300 because the steering diodes HSD, LSD are connected in parallel to the avalanche diode. Thus, the capacitances of the steering diodes HSD, LSD may be used to effectively lower the overall TVS 300 capacitance to a desired value regardless of the capacitance of the avalanche diode.

An n+ buried layer 305 is formed within the first epitaxial layer 303. This n+ buried layer 305 forms the cathode of the high-side steering diode HSD, to be described in more detail below. A p+ implant layer 307 is implanted within the first epitaxial layer 303 below the n+ buried layer 305. The p+ implant layer 307 extends laterally beyond the n+ buried layer 305. The avalanche diode is formed by the n+ buried layer 305, the p+ implant layer 307, the first epitaxial layer 303, and the n+ substrate 301. The buried layer 305 forms the emitter of the avalanche diode, the p+ implant layer 307 forms the base of the avalanche diode, and the first epitaxial layer 303 and n+ substrate 301 collectively form the collector of the avalanche diode.

The avalanche diode (i.e., N-P-N structure) in the TVS 300 illustrated behaves differently than the Zener diode in the conventional TVS 200. Whereas the breakdown voltage behavior of the Zener diode in the conventional TVS 200 was solely dependent on the doping concentration of the p+ implant region and limited by reverse leakage current issues, the breakdown voltage of the avalanche diode in the invented TVS 300 lends itself to more flexibility. The breakdown voltage of the avalanche diode is dependent on two different factors: the breakdown voltage of the P-N junction (i.e., junction between P+ implant layer 307 and N+ buried layer 305) and the gain of the N-P-N structure. The breakdown voltage of the avalanche diode is directly proportional to the breakdown voltage of the P-N junction and inversely proportional to the gain of the N-P-N structure. As such, the doping concentration of the p+ implant layer 307 may remain at a level necessary to prevent reverse leakage current, while the gain of the N-P-N is adjusted in order to obtain a desired TVS breakdown voltage. The gain of the N-P-N structure is dependent on the thickness of the base, which in this case is the p+ implant layer 307. By decreasing the thickness of this p+ implant layer 307, the breakdown voltage of the TVS may also be effectively decreased. Thus, the breakdown voltage of the TVS may be reduced below 6V to support a wider range of applications by decreasing the thickness of the p+ implant layer 307. Because the clamping voltage of the TVS is heavily dependent on the breakdown voltage, it too may also be effectively reduced by adjusting the gain of the avalanche diode (i.e., reducing the thickness of p+ implant layer 307).

A set of isolation trenches 311, 311', 311" are formed within both the second epitaxial layer 309 and the first epitaxial layer 303 and filled with dielectric material 313 (e.g., silicon oxide). The isolation trenches 311, 311', 311" are configured to isolate the low-side steering diode LSD from the high-side steering diode HSD integrated with the avalanche diode.

A set of n+ source regions 319, 319', 319", 319''' are formed within the second epitaxial layer 309. The first and second source regions 319, 319' are located adjacent the right sidewall of the first isolation trench 311 and left sidewall of the second isolation trench 311' respectively, as illustrated. The third source region 319" is located between the second isolation trench 311' and the third isolation trench 311". The fourth source region 319''' is located adjacent the right sidewall of the third isolation trench 311".

A pair of p+ implant regions 321, 321' are formed within the top layer of the second epitaxial layer 309. The first p+ implant region 321 is located between the first and second source regions 319, 319'. The second p+ implant region 321' is located adjacent the left sidewall of the third isolation trench 311'.

The high side diode HSD is formed by the first p+ implant region 321, the second epitaxial layer 309 and the n+0 buried layer 305. The first p+ implant region 321 and second epitaxial layer 309 collectively form the anode of the high-side steering HSD diode and the n+ buried layer 305 forms the cathode of the high-side steering diode HSD. The cathode of the high side steering diode HSD is electrically connected to the emitter of the avalanche diode through the n+ buried layer 305.

The low-side steering diode LSD is formed by the third source region 319", the second epitaxial layer 309, and the second p+ implant region 321'. The second p+ implant region 321' and the second epitaxial layer 309 collectively form the anode of the low-side steering diode LSD and the third source region 319" forms the cathode of the low-side steering diode LSD. Unlike the low-side steering diode in the prior art described in FIG. 2, this low-side steering diode LSD is integrated laterally rather than vertically. However, the lateral integration of the low-side steering diode LSD does not significantly contribute the device package size, and as such the invented TVS 300 is still able to retain a desirable small device package size.

Additionally, an isolation layer (not shown) may be formed above the second epitaxial layer 309 with openings formed therein to provide for metal contacts to components of the TVS device 300. A Vcc pad (not shown) may make contact to the second source region 319' above the avalanche diode through an opening in the isolation layer. An n-type sinker region 317 may optionally be formed between the second source region 319' and the n+ buried layer 305 to allow the avalanche diode to form a connection at the top surface of the device 300 and improve the clamping of the N+ source to the substrate 301 in both positive and negative biased modes of operation. An I/O pad (not shown) may make contact to the p+ implant region 321 (i.e., anode of high-side steering diode) through another opening in the isolation layer. Additionally, a second I/O pad (not shown) may make contact to the third source region 319' (i.e., cathode of low-side steering diode) through yet another opening in the isolation layer. An additional n-type sinker region may be formed between the fourth source region 319" and the first epitaxial layer 303 to allow for an electrical connection (not shown) between the anode of the low-side steering diode LSD and the collector of the avalanche diode.

The TVS 300 in FIG. 3A exhibits improved device behavior characteristics over the prior art TVS 200 described with respect to FIG. 2. By integrating an N-P-N structure in place of the Zener diode, the breakdown voltage of the TVS 300 may be reduced below 6V using the techniques described above. This in turn reduces the clamping voltage to a desirable level without causing unwanted reverse leakage current. Additionally, the TVS 300 retains the low capacitance and small device packaging of the prior art device 200 using the techniques discussed above. The TVS 300 continues to operate and function as described above with respect to the circuit diagram in FIG. 1, albeit with the improved behavioral characteristics described above.

Figure 3B:
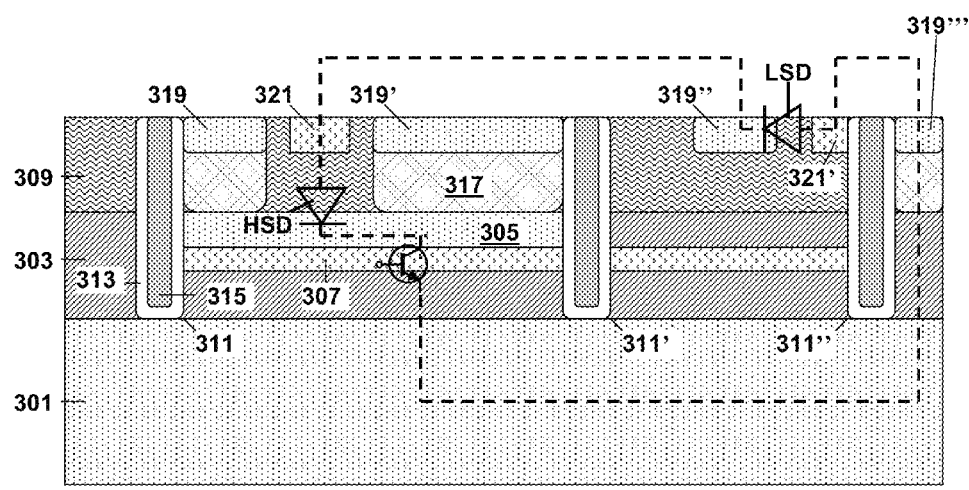
FIG. 3B is a cross-sectional schematic diagram illustrating a transient voltage suppressor (TVS) device in accordance with an alternative embodiment of the present invention.
Figure 3C:
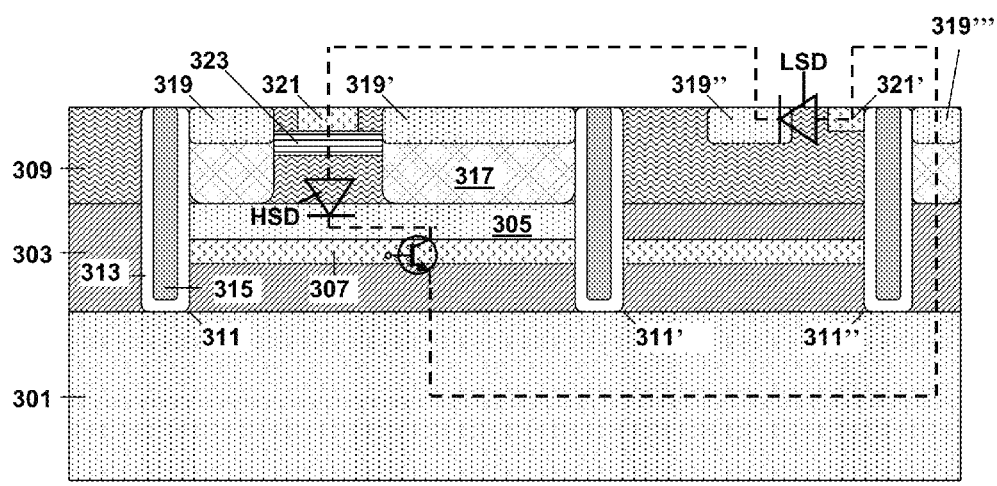
FIG. 3C is a cross-sectional schematic diagram illustrating a transient voltage suppressor (TVS) device in accordance with an alternative embodiment of the present invention.
Figure 3D:
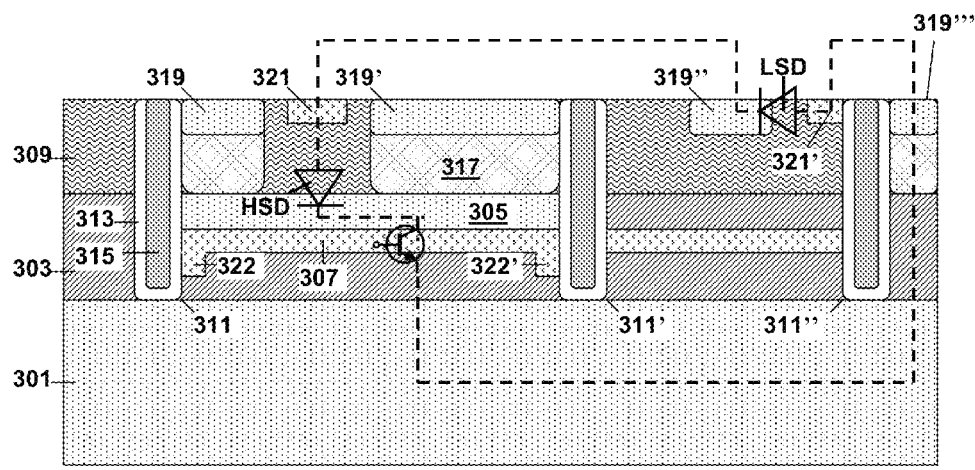
FIG. 3D is a cross-sectional schematic diagram illustrating a transient voltage suppressor (TVS) device in accordance with an alternative embodiment of the present invention.

FIGS. 3B-3D illustrate alternative embodiments of the transient voltage suppressor (TVS) device described above with respect to FIG. 3A. FIG. 3B is a cross-sectional schematic diagram illustrating a transient voltage suppressor (TVS) device in accordance with an alternative embodiment of the present invention.

The TVS 300' in FIG. 3B retains the same structure as the TVS 300 in FIG. 3A, except for the addition of a polysilicon layer 315 within each isolation trench 311, 311', 311". Each isolation trench 311, 311', 311" is first filled with a thin layer of oxide 313 and the remainder is subsequently filled with polysilicon 315. The process of filling a trench 311, 311', 311" with polysilicon 315 rather than oxide greatly simplifies the manufacturing process. Lining the trenches with oxide and filling them with polysilicon is easier than filling the trenches with oxide and avoids a complex process that tends to introduce high stress in the resulting structure. The isolation trenches 311, 311', 311" continue to isolate the low-side steering diode LSD from the high-side steering diode HSD integrated with the avalanche diode. This TVS device 300' continues to operate and function as described above with respect to the circuit diagram in FIG. 1.

FIG. 3C is a cross-sectional schematic diagram illustrating a transient voltage suppressor (TVS) device in accordance with another alternative embodiment of the present invention. The TVS 300" in FIG. 3C retains the same structure as the TVS 300' in FIG. 3B except for the addition of an n-well region 323 within the second epitaxial layer 309. The n-well region 323 is located within the second epitaxial layer 309 below the first p+ implant region 321. The n-well region 323 serves the purpose of providing charge compensation to a particular portion of the second epitaxial layer 309. Because the doping concentration of the second epitaxial layer 309 contributes significantly to the capacitance of both the high-side steering diode HSD and low-side steering diode LSD (which in turn contributes significantly to the overall capacitance of the TVS 300") it is desirable to set the doping concentration of this layer 309 as low as possible. However, simply doping the second epitaxial layer 309 with a minimal doping concentration may not always achieve the desired results. As such, the n-well region 323 may be additionally integrated within the device to effectively counterdope and reduce the average concentration of a portion the second epitaxial layer 309 that contributes to the capacitance of the high-side steering diode HSD. This TVS 300" continues to operate and function as described above with respect to the circuit diagram in FIG. 1.

FIG. 3D is a cross-sectional schematic diagram illustrating a transient voltage suppressor (TVS) device in accordance with yet another alternative embodiment of the present invention. The TVS 300''' in FIG. 3D retains the same structure as the TVS 300' in FIG. 3B except that edge portions 322, 322' of the p+ implant layer 307 extend vertically along a corresponding portion of the right sidewall of the first isolation trench 311 as well as along a corresponding portion the left sidewall of the second isolation trench 311'. Because a portion the p+ implant layer 307 is located between the oxide lining 313 of the first isolation trench 311 and the oxide lining 313 of the second isolation trench 311', doping concentrations at the edges may be reduced due to the oxide 313. As discussed above, the doping concentration of the p+ implant layer is inversely proportional to the breakdown voltage of the avalanche diode and consequently the breakdown voltage of the TVS. Thus, by increasing the doping concentration at the edges of the p+ implant layer 307, we can ensure a lower breakdown voltage of the avalanche diode, which will effectively lower the clamping voltage of the TVS 300'''. This TVS 300' continues to operate and function as described above with respect to the circuit diagram in FIG. 1.

Figure 3E:
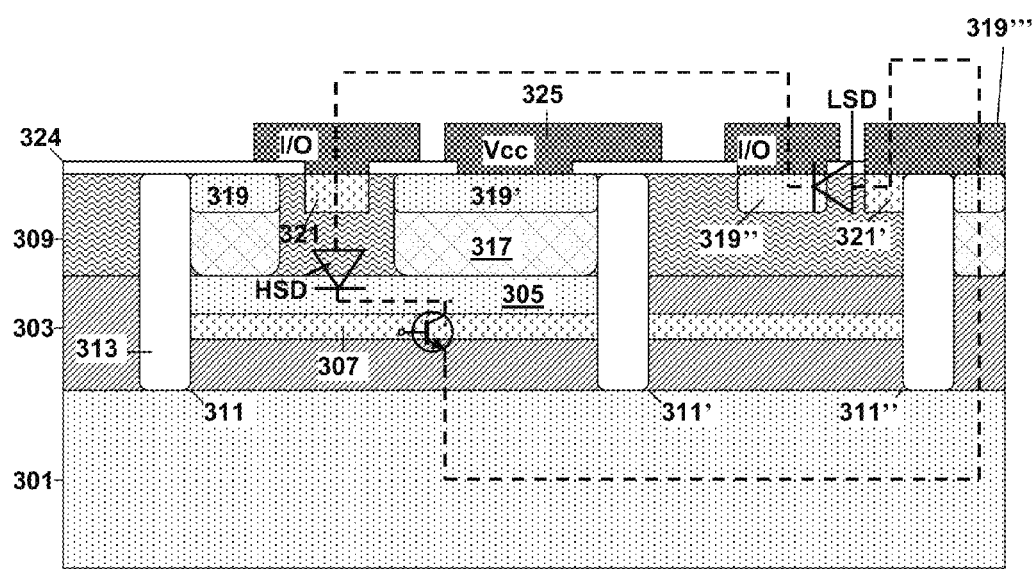
FIG. 3E is a cross-sectional schematic diagram of the transient voltage suppressor in FIG. 3A with the addition of a top-surface insulating layer and corresponding metal pads for forming electrical connections in accordance with an embodiment of the present invention.

FIG. 3E is a cross-sectional schematic diagram of the transient voltage suppressor in FIG. 3A with the addition of a top-surface insulating layer and corresponding metal pads for forming electrical connections in accordance with an embodiment of the present invention. The TVS 300'''' in FIG. 3E retains the same structure as the TVS 300 in FIG. 3A with the addition of a top-surface insulating layer 324 and metal pads 325 for forming electrical connections.

The top-surface insulating layer 324 may be formed directly on top of the second epitaxial layer 309. Several openings may be formed within the top-surface insulating layer 324 to allow metal pads to form electrical contacts/connections to the components of the TVS. An opening may be formed above the second source region 319' to allow a Vcc pad to contact the source region 319'. An opening may also be formed above the first p+ implant region 321 to allow an I/O pad to contact the anode of the high-side steering diode HSD. Another opening may be formed above the third source region 311" to allow an I/O pad to contact the cathode of the low-side steering diode LSD. Additionally, an opening may be formed above the second p+ implant region 321', the third isolation trench 311", and the 4$^{th}$ source region 319" to allow for a metal pad to form an electrical connection between the anode (i.e., second p+ implant region 321') of the low-side steering diode LSD and the collector (i.e., n+ substrate 301) of the of the avalanche diode.

While FIG. 3E depicts the formation of electrical contacts for the TVS depicted in FIG. 3A, the concept may be extended to any of the TVS devices described above.

FIGS. 4A-4L illustrate a method for forming the TVS device depicted in FIG. 3B above. While, the diagrams and description will refer only to the TVS device depicted in FIG. 3B, one ordinarily skilled in the art will recognize that this fabrication method may be easily extended for any of the TVS devices described above by including additional standard processing steps. It is further noted that although only a single device is shown for the sake of convenience, those skilled in the art will recognize that the fabrication sequence in FIGS. 4A-4L can be applied to integrated circuits having multiple such devices arranged in device cells.

Figure 4A:
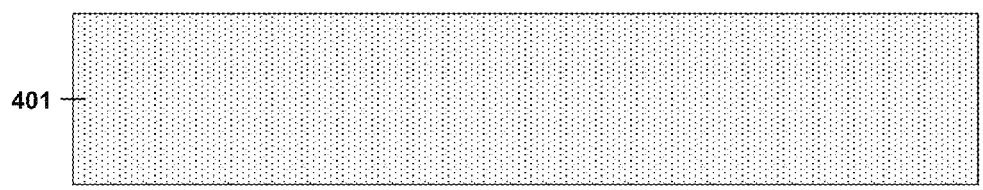
FIGS. 4A-L illustrate a method for forming the TVS device depicted in FIG. 3B according to an embodiment of the present invention.
Figure 4B:
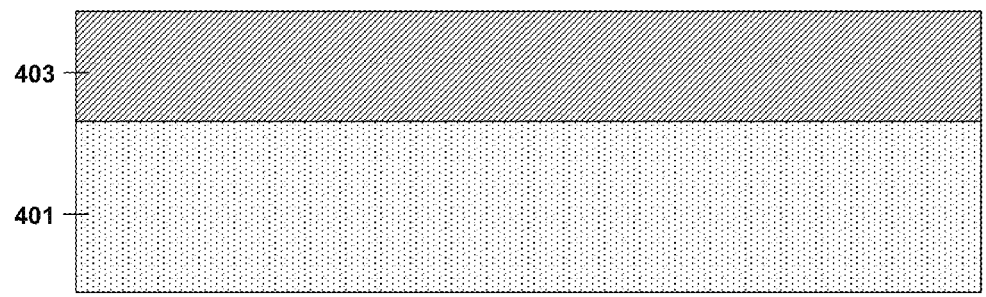

The TVS device begins with an n+ type substrate 401 (e.g., silicon wafer) as illustrated in FIG. 4A. This is in contrast to the p+ type substrate used for most TVS devices. A first epitaxial layer 403 is grown over the n+ type substrate 403 as illustrated in FIG. 4B. The first epitaxial layer 403 may be a lightly doped n− type epitaxial layer. The first epitaxial layer 403 and the n+ substrate 403 will collectively form the collector of the N-P-N device.

Figure 4C:
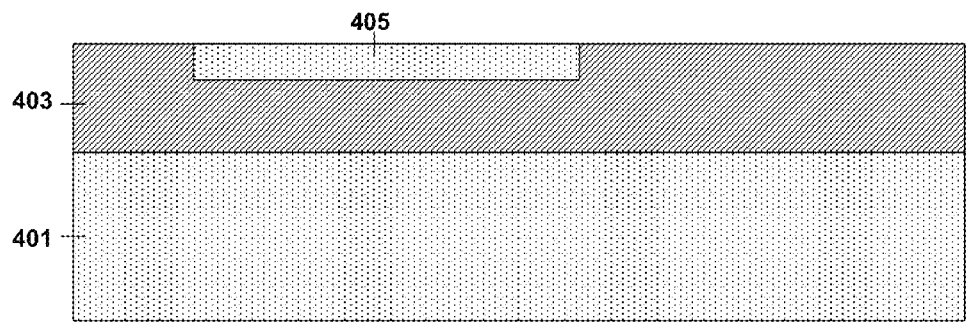
Figure 4D:
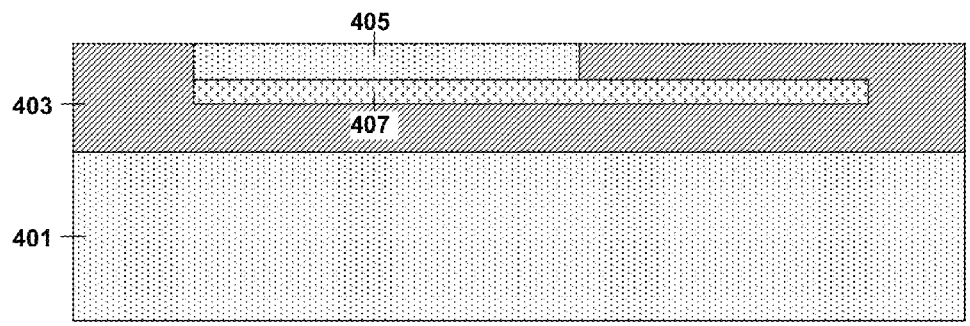

A masked implant (mask not shown) is subsequently performed to form an n+ buried layer 405 as illustrated in FIG. 4C. This n+ buried layer 405 will later act as the cathode of the high-side steering diode HSD and the emitter of the N-P-N avalanche diode. The n+ buried layer 405 only extends along a portion of the length of the first epitaxial layer.

Another masked implant (mask not shown) is then performed to form a p+ implant layer 407. This p+ implant layer 407 will later act as the base of the N-P-N avalanche diode. This p+ implant layer 407 extends beyond the length of the n+ buried layer 405 in order to prevent the low-side steering diode LSD from being short-circuited. The p+ implant is performed following the n+ implant because it requires a higher energy implant to achieve the desired result.

Figure 4E:
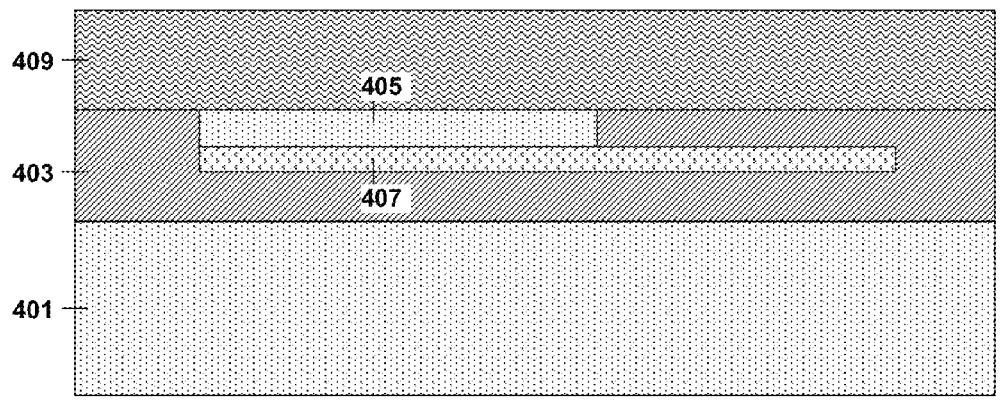

In FIG. 4E, a second epitaxial layer 409 is grown on top of the first epitaxial layer 403. The second epitaxial layer 409 may be a lightly doped p- epitaxial layer. As discussed above, the doping concentration of the second epitaxial layer 409 significantly controls the capacitance of the steering diodes, and as such it is desirable to minimize the doping concentration in order to achieve low device capacitance.

Figure 4F:
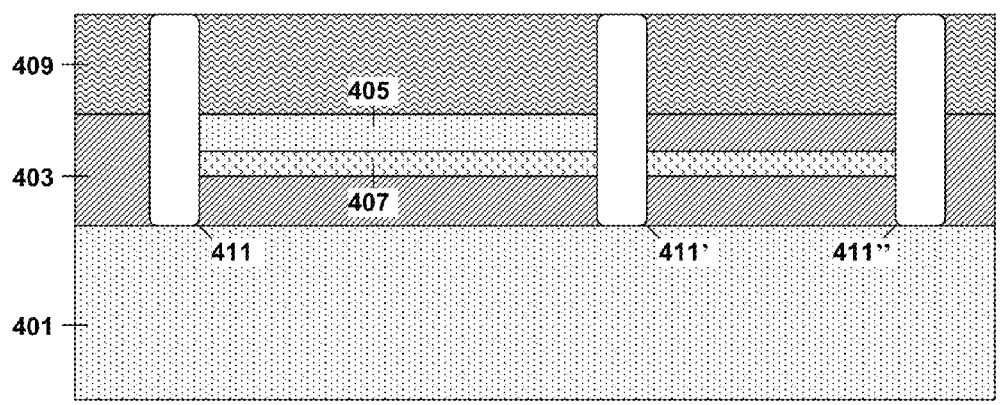
Figure 4G:
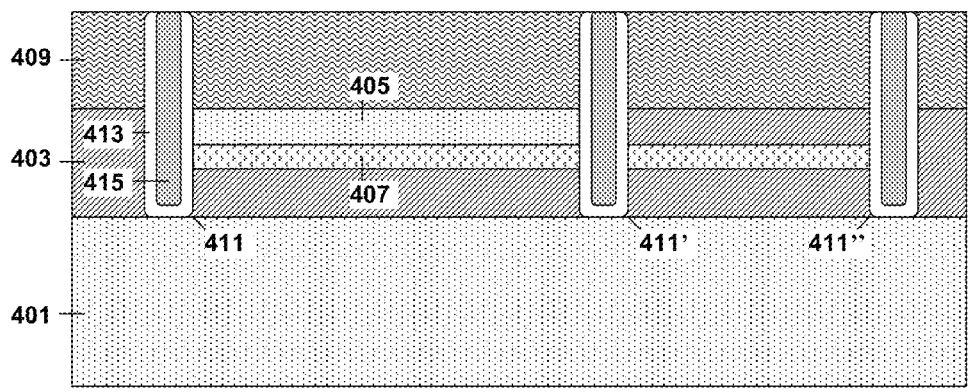

A set of three isolation trenches 411, 411', and 411" are formed within the first epitaxial layer 403 and the second epitaxial layer 409 as illustrated in FIG. 4F. The isolation trenches 411, 411', 411" may be etched using a hard mask (mask not shown) to a depth of approximately 7 microns such that the bottom of the trench is positioned just above the substrate 401. A layer of oxide 413 may then optionally be deposited or grown along the walls of the isolation trench to a thickness of about 50 nm. The remainder of the isolation trench 411 is filled with polysilicon 415. Any excess polysilicon may be removed using an etch-back process. FIG. 4G illustrates the device after oxide growth and polysilicon deposition.

Figure 4H:
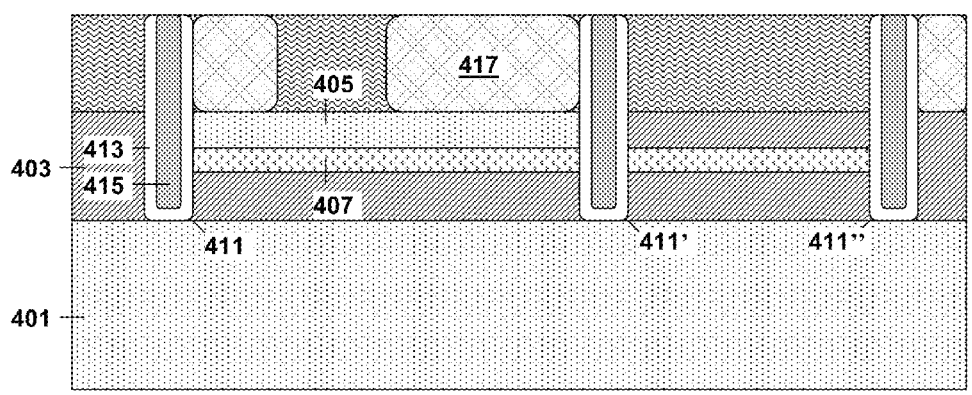
Figure 4I:
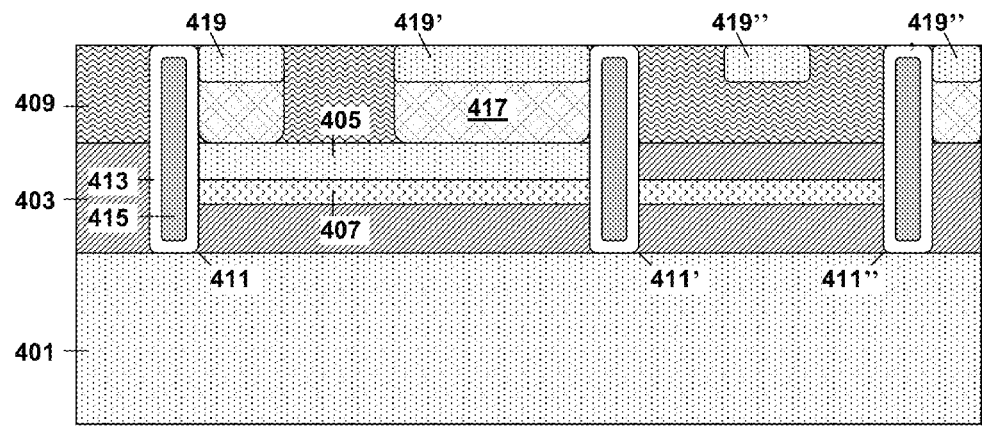

A set of three n type sinkers 417 are deposited within the second epitaxial layer 409 using a hard mark (mask not shown) as illustrated in FIG. 4H. These n type sinkers 417 are configured to provide connections to and to provide connections between the steering diodes and the avalanche diode. A set of four source regions 419, 419', 419", 419''' are then implanted within a top surface of the second epitaxial layer 409 using another hard mask (mask not shown) as illustrated in FIG. 4I. The third source region 419" will later act as the cathode of the lateral low-side steering diode LSD. The fourth source region 419''' provides a contact path to the collector of the N-P-N avalanche diode.

Figure 4J:
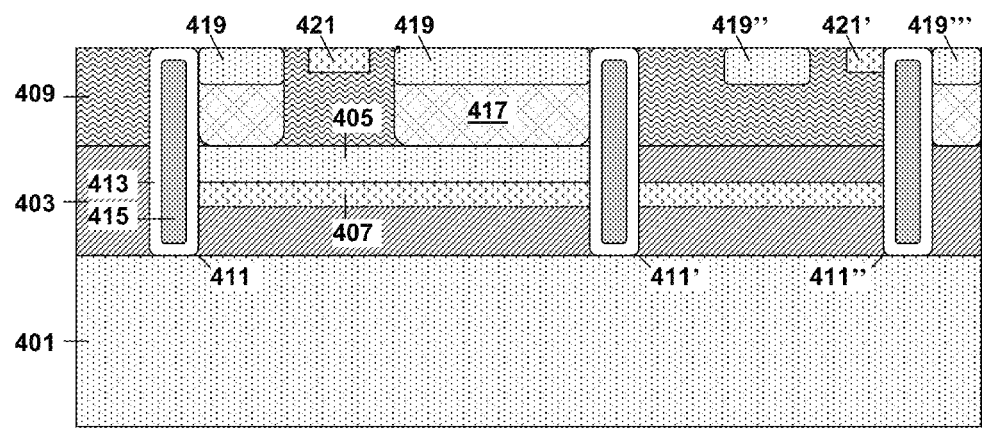

A pair of p+ implant regions 421, 421' are then implanted using a mask (mask not shown) within the top surface of the second epitaxial layer 409 as illustrated in FIG. 4J. The first p+ implant region 421 is between the first source region 419 and the second source region 419'. The second p+ implant region 421' is situated adjacent a sidewall of the third trench 411" between the third source region 419" and the third trench 411". The first p+ implant region 421 and the second epitaxial layer 409 collectively form the anode of the vertical high-side steering diode HSD, while the n+ buried layer 405 forms the cathode of the vertical high-side steering diode HSD. The second p+ implant region 421' and the second epitaxial layer 409 form the anode of the lateral low-side steering diode LSD, while the third source region 419" forms the cathode of the lateral low-side steering diode LSD.

Figure 4K:
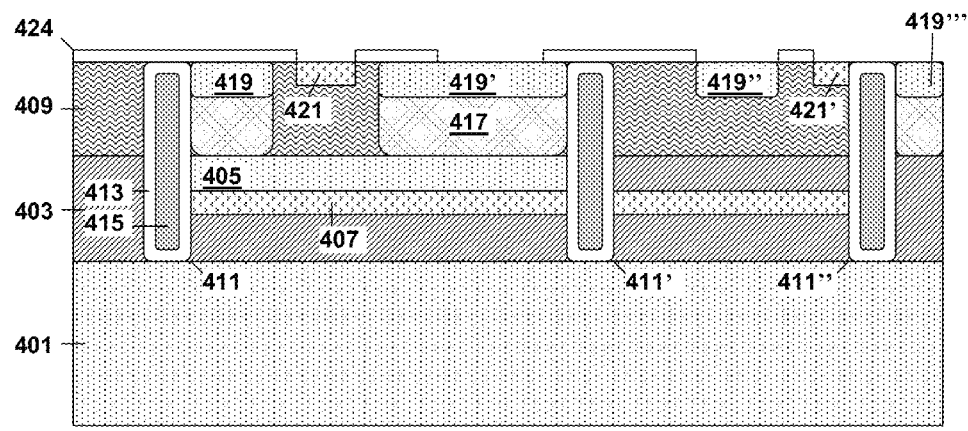
Figure 4L:
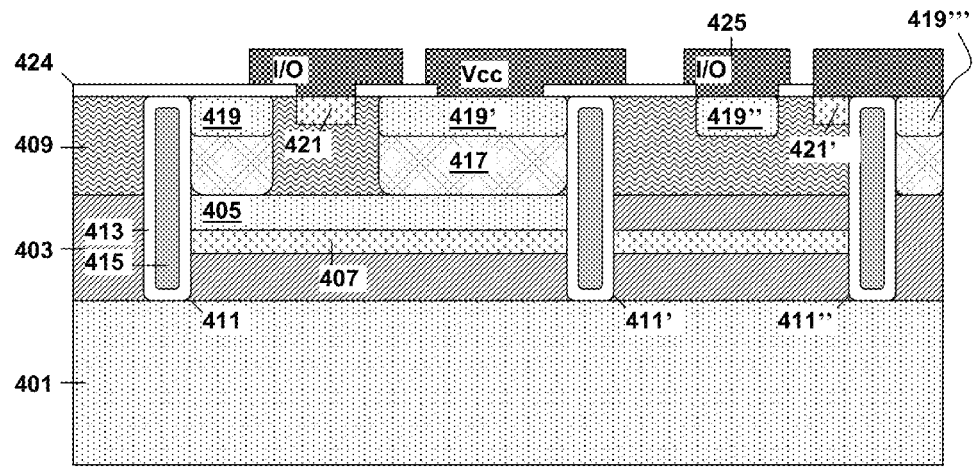

An insulating layer 424 (e.g., silicon oxide) may be optionally deposited on top of the second epitaxial layer 409 as illustrated in FIG. 4K. Openings may be formed in the insulating layer 424 using conventional techniques in order to provide points of contact to the TVS device. An opening may be formed above the first p+ implant region 421 in order to allow for a contact to be made to the anode of the high-side steering diode. Another opening may be formed above the second source region 419' to allow for a contact to be made to the emitter of the avalanche diode. A third opening may be formed above the third source region 419" in order to allow for a contact to be made to the cathode of the lateral low-side steering diode. Lastly an opening may be formed above the second p+ implant region 421', third isolation trench 411', and fourth source region 419''' to allow for an electrical connection to be made between the lateral low-side steering diode and the avalanche diode.

Lastly, metal pads 425 may be formed within the insulating layer 424 openings to provide to electrical contacts/connections to the components of the TVS. A Vcc pad may fill the opening above the second source region 419' to allow a voltage source to contact the source region 319'. An I/O pad may contact the anode of the high-side steering diode HSD through the opening formed above the first p+ implant region 421. Another I/O pad may contact the cathode of the low-side steering diode LSD through the opening formed above the second p+ implant region 419". Lastly, a metal pad may be deposited over the opening formed above the second p+ implant region 421', the third isolation trench 411", and the $4^{th}$ source region 419" to form an electrical connection between the anode (i.e., second p+ implant region 421') of the low-side steering diode LSD and the collector (i.e., n+ substrate 401) of the of the avalanche diode.

As discussed above, the steps discussed above for TVS fabrication are limited to the TVS device depicted in FIG. 3B, however additional process steps may be included in order to fabricate any of the other TVS discussed above. For example, an additional masked implant may be used to form the n-well region 323 of the TVS device in FIG. 3C. Extended portions of the p+ layer may be formed by implantation through the contact mask.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6.

What is claimed is:

1. A method for manufacturing a transient voltage suppressor (TVS) device, comprising:
    a) forming a first epitaxial layer of a first conductivity type on top of an n-type semiconductor substrate;
    b) forming a buried layer of an n-type semiconductor material within a top surface of the first epitaxial layer;
    c) forming an implant layer of a p-type semiconductor material within the first epitaxial layer, wherein the implant layer is located below the buried layer and a length of the implant layer extends beyond a length of the buried layer;
    d) forming a second epitaxial layer of a p-type semiconductor material type on top of the first epitaxial layer;

e) forming a set of trenches in the second epitaxial layer and the first epitaxial layer, the set of trenches include a first trench at an edge of the buried layer and an edge of the implant layer, and a second trench at another edge of the implant layer;

f) lining each trench with a dielectric material;

g) filling a remaining portion of each trench with dielectric material or polysilicon;

h) forming a set of source regions of a n-type semiconductor material within a top surface of the second epitaxial layer, the set of source regions including first and second source regions located between the first and second trenches a third source region located such that the second trench is between the second and third source regions;

i) ) forming a pair of implant regions of a p-type semiconductor material within the top surface of the second epitaxial layer, the pair of implant regions including a first implant region located between the first source region and the second source region, and a second implant region located between the second trench and the third source region adjacent a sidewall of the second trench, a vertical PN junction being formed by the buried layer, second epitaxial layer and first implant region, a lateral PN junction being formed by the third source region, second epitaxial layer and second implant region.

2. The method of claim 1, wherein the substrate is made of a doped n-type semiconductor material.

3. The method of claim 1 wherein the first epitaxial layer is made of an n-type semiconductor material.

4. The method of claim 3, wherein the semiconductor material of the buried layer is a doped n-type semiconductor material having a higher concentration of n-type dopants than the first epitaxial layer.

5. The method of claim 1, further comprising forming a well region of an n-type semiconductor material within the second epitaxial layer, the well region being located below the first implant region and between the first source region and the second source region.

6. The method of claim 1, further comprising extending edge portions of the implant layer corresponding sidewalls of the first and second trench vertically along the corresponding sidewalls.

7. The method of claim 1, further comprising forming a set of sinker regions of an n-type semiconductor material within the second epitaxial layer, the set of sinker regions including a first sinker region being located adjacent a sidewall of the first trench between the first source region and the buried layer, and a second sinker region being located adjacent a sidewall of the second trench between the third source region and the first epitaxial layer, the formation of the set of sinker regions being completed after step g) but before step h).

8. A transient voltage suppressor (TVS) device comprising:

a) an n-type semiconductor substrate;

b) a first epitaxial layer of an n-type semiconductor material on the substrate;

c) a buried layer of an n-type semiconductor material located within the first epitaxial layer;

d) an implant layer of a p-type semiconductor material located within the first epitaxial layer below the buried layer, the implant layer extending laterally beyond the buried layer, an NPN junction being formed by the buried layer, implant layer, first epitaxial layer and substrate;

e) a second epitaxial layer of a p-type semiconductor material supported on top of the first epitaxial layer;

f) a set of trenches formed within the second epitaxial layer and the first epitaxial layer, each trench in the set being at least lined with a dielectric material, the set of trenches including a first trench at an edge of the buried layer and an edge of the implant layer, and a second trench at another edge of the implant layer; and g) a set of source regions of an n-type semiconductor material formed within a top surface of the second epitaxial layer, the set of source regions including first and second source regions located between the first and second trenches, a third source region located such that the second trench is between the second and third source regions; and h) a pair of implant regions of a p-type semiconductor material formed in the second epitaxial layer, the pair of implant regions including a first implant region located between the first source region and the second source region, and a second implant region located between the second trench and the third source region adjacent a sidewall of the second trench, a vertical PN junction being formed by the buried layer, second epitaxial layer and first implant region, a lateral PN junction being formed by the third source region, second epitaxial layer and second implant region.

9. The device of claim 8, wherein the substrate is a doped n-type semiconductor substrate.

10. The device of claim 9, wherein the n-type semiconductor material of the first epitaxial layer is an n-type material having a lower n-type doping concentration than the substrate.

11. The device of claim 10 wherein the semiconductor material of the buried layer is a doped n-type semiconductor material having a higher concentration of n-type dopants than the first epitaxial layer.

12. The device of claim 8, wherein each of the first and second trenches is filled with dielectric material.

13. The device of claim 8, wherein each trench in the set of trenches is filled with polysilicon.

14. The device of claim 8, further comprising a well region of an n-type semiconductor material formed within the second epitaxial layer, the well region being located below the first implant region and between the first source region and the second source region.

15. The device of claim 8, wherein edge portions of the implant layer adjacent to corresponding sidewalls of the first and second trenches extend vertically along the corresponding sidewalls.

16. The device of claim 8, further comprising a set of sinker regions of n-type semiconductor material formed within the second epitaxial layer, a first sinker region being located adjacent a sidewall of the first trench between the first source region and the buried layer, and a second sinker region being located adjacent a sidewall of the second trench between the third source region and the first epitaxial layer.

17. The device of claim 16, wherein the n-type semiconductor material of the set of sinker regions is a heavily doped n-type semiconductor material.

* * * * *